United States Patent
Kulkarni et al.

(10) Patent No.: US 6,480,137 B2
(45) Date of Patent: Nov. 12, 2002

(54) METHOD OF GENERATING MATCHED CAPACITOR ARRAYS

(75) Inventors: Sanjay S. Kulkarni; Senthil Kumar Subramanian; Ramanchandra Venkateswara Sharma, all of Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 17 days.

(21) Appl. No.: 09/796,045

(22) Filed: Feb. 28, 2001

(65) Prior Publication Data

US 2002/0118130 A1 Aug. 29, 2002

(51) Int. Cl.[7] ................................. H03M 1/12
(52) U.S. Cl. ...................... 341/172; 341/144; 341/155; 341/134; 341/150; 341/120; 716/2; 716/3; 716/10; 716/11; 716/12; 716/13; 757/532; 307/109
(58) Field of Search ................... 341/144, 155, 341/172, 134; 716/3, 10, 11

(56) References Cited

U.S. PATENT DOCUMENTS

| | | | | |
|---|---|---|---|---|
| 4,399,426 A | * | 8/1983 | Tan | 341/120 |
| 5,235,335 A | * | 8/1993 | Hester et al. | 341/121 |
| 5,353,028 A | * | 10/1994 | de Wilt et al. | 323/315 |
| 5,952,952 A | * | 9/1999 | Choi et al. | 341/172 |
| 5,973,633 A | * | 10/1999 | Hester | 341/155 |
| 6,016,019 A | * | 1/2000 | Wojewoda | 307/109 |
| 6,225,678 B1 | * | 5/2001 | Yach et al. | 257/532 |

OTHER PUBLICATIONS

U.S. Pub No. US 2001/0017383A1, Yach et al, Layout Technique for a capacitor array using a continuous upper electrodes, Aug. 30, 2001.*

* cited by examiner

*Primary Examiner*—Michael Tokar
*Assistant Examiner*—Lam T. Mai
(74) *Attorney, Agent, or Firm*—Dwight Holmbo; Frederick J. Telecky, Jr.; W. James Brady

(57) ABSTRACT

An algorithmic procedure automatically generates layout of matched capacitor arrays used in A/D converters, D/A converters and programmable gain amplifiers, among other types of devices, using templates to define the style of the layout. Since each array can be generated from a particular template, multiple arrays associated with an IC can be optimized for different purposes to preserve silicon area. The automated technique allows fast and easy migration of an array layout from one process to another and eliminates the manual design work generally associated with capacitor array layout.

23 Claims, 4 Drawing Sheets

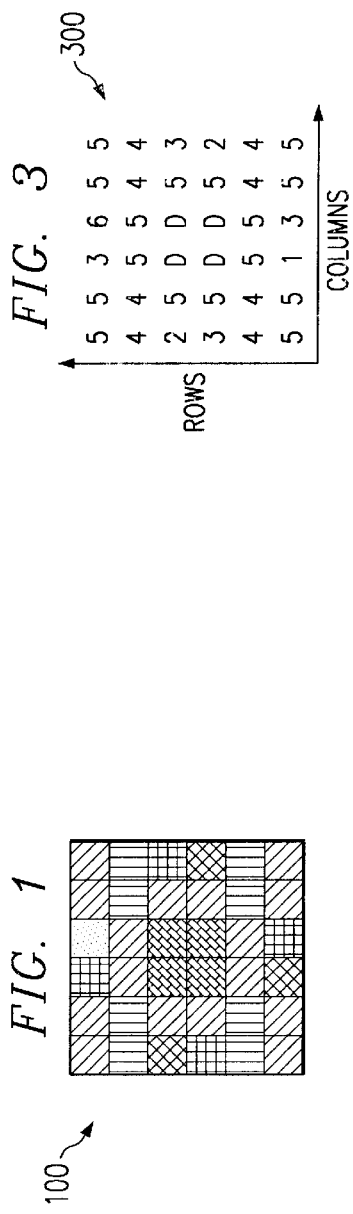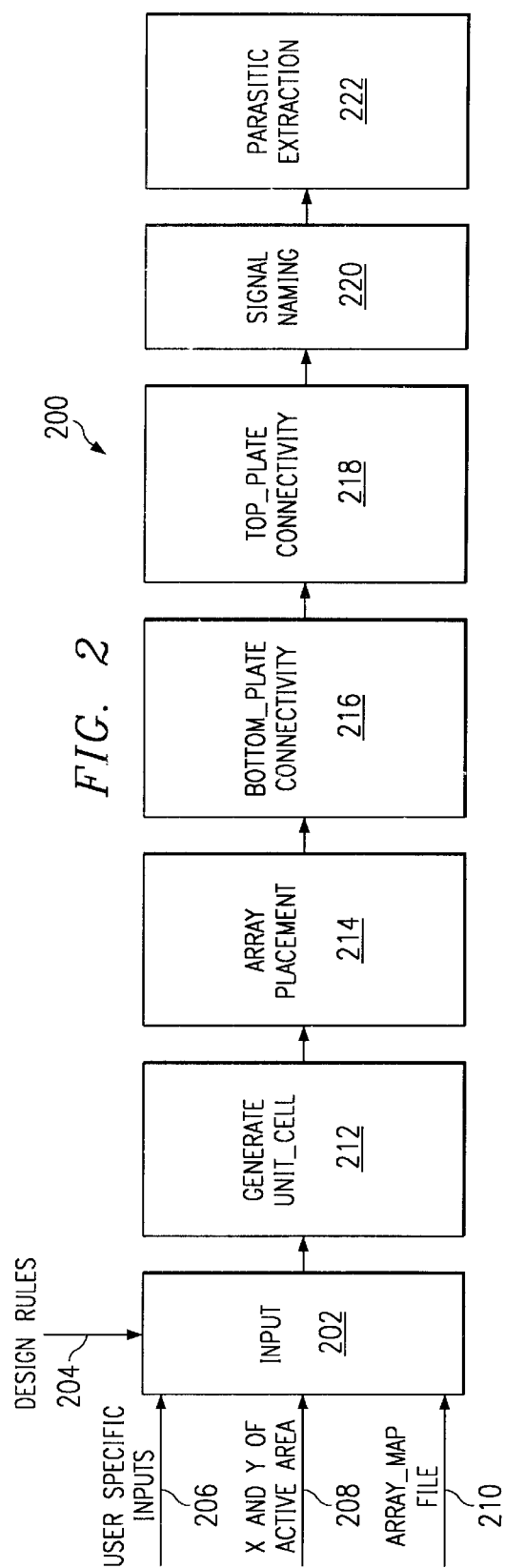

```
8 5 D
6 D 4
1 5 4    ~600
```

```
8 5 D → TOTAL NUMBER OF CONTROL LINES ARE 2
6 D 4 → TOTAL NUMBER OF CONTROL LINES ARE 2
1 5 4 → TOTAL NUMBER OF CONTROL LINES ARE 3
```

```
8 5 9
6 9 4
1 5 4    ~800
```

900

```
8 5 9 → 2 1 3
6 9 4 → 2 3 1
1 5 4 → 1 3 2
```

```
8 5 9 → 2 1 3
```

BOTTOM PLATE CONTROL LINES
- D-9
- 1-5
- 2-8
- D-9
- D-9

1 4 5 6 8 9

1200

```
8 5 9 → 5 3 6
6 9 4 → 4 6 2
1 5 4 → 1 3 2
```

METHOD OF GENERATING MATCHED CAPACITOR ARRAYS

BACKGROUND OF THE INVENTION

1. Field of the Invention

This invention relates generally to matched capacitor arrays, and more particularly to a method of generating matched capacitor arrays for use in association with analog-to-digital (A/D) converters, digital-to-analog (D/A) converters, programmable gain amplifiers, and the like.

2. Description of the Prior Art

Capacitors are used for input signal storage/gain in programmable gain amplifiers, A/D converters, D/A converters and the like where the input signal is analog in nature. Any error in the design or layout of the capacitor array affects the linearity performance of the respective circuit. This makes the capacitor array a critical component of the device.

A capacitor array is a set of capacitors placed in a particular fashion within a planar (e.g. XY) space. The capacitors in an array are divided into different groups that are related to one another by a defined ratio. A capacitor array is laid out as a set of unit capacitors as a first step towards improving the matching of the array.

Capacitor mismatch occurs as a result of processing errors such as patterning and etching variations. Some of these result in spatial variation of the capacitance value and other characteristics in random variation. Parasitic (unintentional) capacitance also must be matched for all the unit capacitors in the array, since capacitor mismatch directly affects the linearity performance of the design. The effects of spatial variation of capacitance can be minimized to a large extent by careful arrangement of the unit capacitors in a predetermined fashion. The foregoing factors make the layout of a capacitor array complicated wherein the criticality of the array layout increases as the resolution increases.

Layout cycle time of a capacitor array is generally about three weeks for the following reasons: 1) manual creation and integration of several tasks; 2) post layout error checking; 3) design rules differ from process to process, which prevents the user from reusing an existing array in some other process without modifying the layout; and 4) post processing and parasitic extraction for the array.

One example of systematic spatial variation regarding capacitance values is directed to variation of thick-oxide in a given area of silicon, that acts as di-electric for the capacitors. Unit capacitors belonging to a group should be distributed in a given area such as illustrated in FIG. 1, to cancel the mismatch and avoid this difficulty.

Metal layers are used to connect all of the top and bottom plates of capacitors within an array. Any overlap of these metal layers with themselves and other layers results in parasitic capacitance that adds to the absolute value of the unit capacitor. If the parasitic capacitance is not the same for all the unit capacitors, then there will be a mismatch between the capacitors. Since the top and bottom plate lines are very sensitive, any parasitic capacitance increase the chance of coupling between these lines and other lines which are noisy, thereby degrading the array performance. The foregoing difficulties can be overcome by minimizing the parasitics. Where the parasitics cannot be minimized or avoided, they should be the same for all unit capacitors. These requirements severely complicate the layout of a capacitor array.

Cycle time for completing a capacitor array layout is about three weeks, as stated herein before. It can be appreciated that three weeks is a very significant amount of time in the design cycle time of any project. This design cycle time is necessary for manual creation and integration of several tasks that include generation of the unit capacitor, placement of unit capacitors within an array, routing of bottom plate control lines, connection of bottom plates associated with all capacitors, top plate line connectivity, shielding for matching, and verification of layout for connectivity and process design rules. Quality checks for accuracy are also necessary.

Each unit capacitor in the array is unique since its capacitance value gets defined by its location in the array (due to the spatial variation effect). No layout verification tool can verify this since all unit capacitors are assumed to have the same value. This necessitates manual checking of the arrangement of the unit capacitors. Such manual checking is error prone and increases the cycle time.

Any layout modification(s) to an existing array is/are also very difficult. If a polygon in the layout needs to be modified, for example, then the full array needs to be modified to satisfy all the design rules of the new process.

As stated above, the array should be verified with the design for all connectivity subsequent to completion of layout work for the array that should be complete through all of the design rules defined for the process which also adds to the total cycle time. Further, detailed information regarding the parasitics of the array are very much necessary to analyze the linearity performance of the capacitor array. Generating this detailed parasitic information further adds to the time consuming cycle time.

In view of the foregoing, a need exists in the capacitor array generation art for an efficient and cost effective automated layout procedure to generate capacitor arrays that are analogous in nature.

SUMMARY OF THE INVENTION

The present invention is directed to a method of generating matched capacitor arrays for use in association with analog-to-digital (A/D) converters, digital-to-analog (D/A) converters, programmable gain amplifiers, and the like. The method provides correct by construction capacitor arrays within a short (optimal) design cycle time.

As used herein, the following words have the following meanings. The words "algorithmic software" mean an algorithmic program used to direct the processing of data by a computer or data processing device. The words "data processing device" as used herein refer to a CPU, DSP, microprocessor, micro-controller, or other like device and an interface system. The interface system provides access to the data processing device such that data could be entered and processed by the data processing device. The words "discrete data" as used herein are interchangeable with "digitized data" and "digitized data" as used herein means data which are stored in the form of singularly isolated, discontinuous data or digits.

In one aspect of the invention, a method is implemented to provide a correct by construction capacitor array in a manner that significantly reduces design cycle time and resolves difficulties associated with quality checking of the array and providing parasitic information in user friendly way, by integrating all of the tasks that are necessary for manual generation of a capacitor array.

In still another aspect of the invention, a method is implemented to provide a correct by construction capacitor array in a manner that functions with a minimum number of inputs.

In yet another aspect of the invention, a method is provided to implement a correct by construction capacitor array in a manner that requires only a capacitor array map.

In another aspect of the invention, a method is provided to implement a correct by construction capacitor array in a manner that automatically generates other inputs with the help of a user provided capacitor array map.

In still another aspect of the invention, a method is provided that allows use of design rules for different processes to allow capacitor array tailoring specific to each design.

In yet another aspect of the invention, a method is provided to eliminate design rule errors in capacitor array layout to facilitate manufacturability requirements.

In another aspect of the invention, a method allows multiple integrated circuit capacitor arrays to be optimized for different purposes to preserve silicon area.

In still another aspect of the invention, a method allows fast and easy migration of a capacitor array layout from one process to another.

One embodiment of the present method most preferably is implemented using algorithmic software such that a data processing device can operate on user supplied discrete data including capacitor array design rules, a capacitor array map file, custom (user specified) rules, and unit capacitor cell x and y active area dimensions to:

generate a unit capacitor cell;

generate a master data file;

place a plurality of unit capacitor cells in array fashion according to unit capacitor cell data and the master data file;

map group numbers associated with the unit capacitor cells in each row to virtual numbers;

determine bottom capacitor plate connectivity requirements via the mapped virtual numbers; and determine top capacitor plate connectivity requirements.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein:

FIG. 1 illustrates a capacitor array in which each large square defines a unit capacitor and in which all capacitors with the same fill patterns belong to the same group;

FIG. 2 is a flow diagram illustrating a capacitor array layout automation procedure according to one embodiment of the present invention;

FIG. 3 is an array map file associated with the unit capacitor distribution associated with the capacitor array depicted in FIG. 1;

Figure 4:
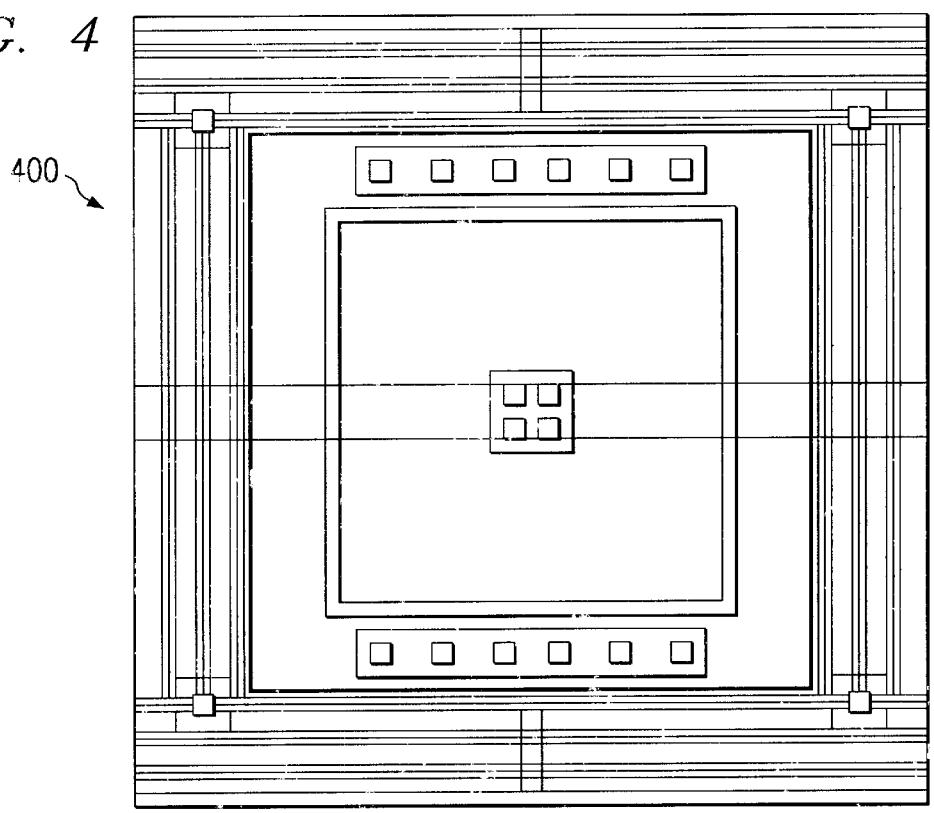
FIG. 4 illustrates a unit capacitor employed in a commercially available capacitor array.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

FIG. 1 illustrates a capacitor array 100 in which each large square 102 defines a unit capacitor and in which all capacitors with the same fill patterns belong to the same group.

FIG. 2 is a flow diagram illustrating a capacitor array layout automation (CALA) procedure 200 according to one embodiment of the present invention. As set forth herein, CALA procedure 200 is implemented to take advantage of capacitor repeatability characteristics associated with a capacitor array. Specifically, CALA is a method that reduces the design cycle time by integrating all of the tasks that are necessary in manual generation of an array, and that solves difficulties associated with quality checking of the array and parasitic extraction, as stated herein before. CALA is implemented to provide a correct by construction array. As set forth below, each block shown in FIG. 2 represents a particular task that is used to layout a capacitor array. Principles associated with each task are now set forth below in greater detail.

Input block 202 receives all of the inputs 204–210 necessary to generate an array. These inputs 204–210 include design rules 204, user specific rules 206, X and Y dimensions of the active area(s) 208, and an array map file 210.

Design rules 204 are the interlayer rules defined for a particular process. These rules 204 are used while drawing the rectangles to form a device in a layout cell. In a capacitor array, these rules 204 are necessary to draw all metal layers and also layers that are used to form a capacitor.

User specific rules 206 are additional to the process design rules 204. These are the custom rules and can be specified by the user.

X and Y of active area rules 208 are used to specify the active area associated with a capacitor. This information will be used while generating the unit capacitor cell.

The array map file 210 serves as the basic and major input for the CALA procedure. FIG. 3 is an array map file 300 associated with the unit capacitor distribution associated with the capacitor array 100 depicted in FIG. 1. The array map file (e.g. 210, 300) is the ASCII representation of the capacitor distribution in an area having dimensions X by Y. If the array map file 210 is treated as a matrix, then the total number of capacitors in the array can be calculated by multiplying rows with columns. Multiplying the area of a unit capacitor cell by the total number of capacitors, the area of the array can be determined with the X and Y dimensions. Further, the total number of groups in a particular row can be defined simply by looking at the different numbers in the row. This helps in defining the number of control lines to be routed between rows of capacitors. Each element in an array can be identified with an identification number (e.g. ID=1,1 identifies an element belonging to row 1 and column 1). This information is helpful in defining the properties for all capacitor cells of an array. Element (1,1), for example, belongs to group 5 for the array map file 300, and should therefore be connected to the control line of group 5. Using all the inputs 204–210, a master data file is generated containing information such as location of each unit capacitor cell in an array, group name to which each unit capacitor cell belongs, and the total number of control lines that need to be routed between rows of capacitors, among other things.

FIG. 4 illustrates a unit capacitor 400 employed in a commercially available capacitor array. Generation of a unit capacitor cell 400 is depicted as block 212 in FIG. 2. X and Y dimensions of an active area provided by a user, total number of control lines available in the master data file discussed above, design and custom rules are used as the inputs for this block 212. Using a reference point, X and Y co-ordinates are determined for all polygons. The design and custom rules are carefully considered during calculation of the co-ordinates. Using co-ordinates and layers to define a capacitor and metal used for inter-connectivity, a unit capacitor cell 400 is than generated as shown in block 212.

Subsequent to unit capacitor cell generation 212, array placement is performed as shown in block 214 in FIG. 2. Co-ordinates for all of the capacitors to be placed in an array fashion are available in the master data file as stated herein before. Unit capacitor cell and the master data file provide the requisite inputs for this block 214. The top cell for which a name is specified by the user, is created in the given library. Having the origin as 0:0, all the unit capacitor cells are then placed in the layout cell. This top cell name is returned to the main module once the placement is complete.

Bottom plate connectivity is next performed as shown in block 216 of FIG. 2. Element numbers in each and every row are first mapped to a virtual number (e.g. 4 5 4 3 2 may be numbers from the array map file). Then, 3 4 3 2 1 can represent the virtual numbers for the row. This relates group numbers in a row to a specific set of numbers. For the instant case, the set of numbers includes 1, 2, 3 and 4. This process helps to ensure the control lines for the row are routed in ascending order and relates each element number with a row number. If the element number is 3 (virtual number) for example, then it should be connected to the third control line from the top. Using this technique for all array elements, the location of a cut layer to be used for connecting two metal layers can be determined. This cut layer (vias or contact) is positioned at the determined location. All control lines that are spread across different rows are then connected to a main line, which completes the process of connecting the bottom plates to the control lines.

Top plate connectivity is next performed as shown in block 218 of FIG. 2 in which the top plates of all the unit capacitors are connected to a main top plate line. The width of this top plate line is determined by the custom rules provided by the user. Generally, the top plate line is very sensitive to noise, and so is shielded via a quiet line to minimize parasitics.

Figure 5:
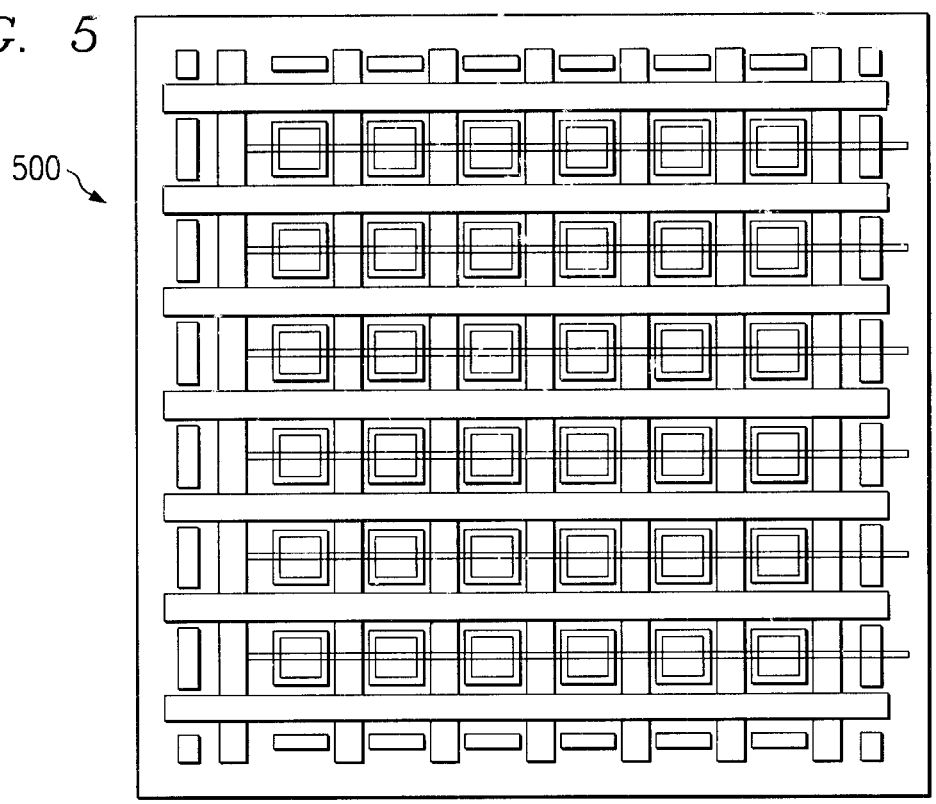
FIG. 5 illustrates a capacitor array layout that employs the unit capacitor depicted in FIG. 4.

Following connection of all unit capacitors to the main top plate line, signal names are generated as shown in block 220 of FIG. 2, with the help of group numbers. Group number 3, for example, may be assigned a signal name such as control_3 that is connected to the third control line from the top. Signal names are thus placed on the main control lines, that are generated in the (Bottom Plate Connectivity) block 216. The location associated with placement of signal names are determined such that names will be placed for all control lines, which completes layout generation of the array. FIG. 5 illustrates a capacitor array layout 500 that employs the unit capacitor 400 depicted in FIG. 4.

The accuracy of the capacitor array layout 500 can be determined via a userfriendly report regarding parasitic extraction such as shown in block 222 of FIG. 2. Parasitic extraction 222 includes generation of a detailed report on parasitics associated with all signal names in an array. Using a tool familiar to those skilled in the art, parasitics can be extracted from the final layout. Then, using custom scripts, information on parasitics with respect to each signal or node present in the array is generated to analyze the array regarding accuracy parameters.

Bottom plate connectivity associated with the capacitor array layout method 200 illustrated in FIG. 2 is further explained herein below with reference to a 3-bit array map file 600 shown in FIG. 6 as well as FIGS. 7–14. Specifically, method 200 generates all inputs necessary to implement a capacitor array layout from a given array map file, as discussed herein before. The numbers 1, 4, 5, 6 and 8 shown in array map file 600 represent different groups of capacitors in the array. The letter 'D' represents a dummy capacitor used for systematic spatial variation cancellation within the array.

Figures 6, 7, 8, 9, 10, 11, 12, 13:
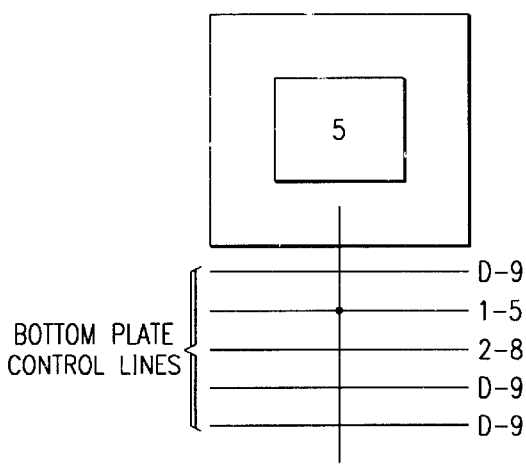
FIG. 6 illustrates an array map file associated with another capacitor array.
FIG. 7 is a diagram illustrating a technique to determine the total number of bottom plate control lines in each row of the array map depicted in FIG. 6 according to one embodiment of the present invention.
FIG. 8 is a diagram illustrating a technique to identify all of the numbers in each row of the array map depicted in FIG. 6 in ascending fashion according to one embodiment of the present invention.
FIG. 9 is a diagram illustrating a technique to replace each element in each row of the array map depicted in FIG. 6 with its equivalent ascending number according to one embodiment of the present invention.
FIG. 10 is a diagram illustrating the first row of the array map depicted in FIG. 6 in which each element is replaced with its equivalent ascending number.
FIG. 11 is a pictorial diagram illustrating a method of bottom plate connectivity associated with the array map depicted in FIG. 6 according to one embodiment of the present invention.
FIG. 12 is a diagram illustrating a technique to identify all unique numbers in an array for the array map depicted in FIG. 6 according to one embodiment of the present invention.
FIG. 13 is a diagram illustrating a technique to replace all elements of the array map depicted in FIG. 6 with their position in the unique number list depicted in FIG. 12 according to one embodiment of the present invention.

FIG. 7 is a diagram illustrating a technique to determine the highest number of bottom plate control lines across all rows of the array map file 600 depicted in FIG. 6 according to one embodiment of the present invention. The total number of bottom plate control lines is first determined for each row. The top row and middle row each have two control lines while the bottom row has three control lines. The highest number of bottom plate control lines across all rows for the array map file 600 is therefore three (3).

FIG. 8 is a diagram illustrating a technique to identify all of the numbers in each row of the array map file 600 depicted in FIG. 6 in ascending fashion according to one embodiment of the present invention. It can be seen that the 'D' element has been replaced with the highest number (3) of control lines across all the rows plus one (3+1=4). This step is helpful in identifying all the numbers in each row in ascending fashion, which can then be used for the bottom plate connectivity step 216 shown in FIG. 2.

Each element in each row of the array 800 is next replaced with its equivalent ascending number as illustrated in FIG.

9 that is a diagram illustrating a technique to replace each element in each row of the array map depicted in FIG. 6 with its equivalent ascending number according to one embodiment of the present invention. In the first row, there are three different group elements. The lowest number is five (5). The number 5 is therefore replaced with a one (1). The number 8 is replaced with a two (2); and the number 9 is replaced with a three (3). This technique is then repeated for each row separately as illustrated in FIG. 9.

FIG. 10 is a simple diagram illustrating the first row of the array map file 600 depicted in FIG. 6 in which each element is replaced with its equivalent ascending number as discussed herein above.

FIG. 11 is a pictorial diagram illustrating a method of bottom plate connectivity associated with the array map file 600 depicted in FIG. 6 according to one embodiment of the present invention. The bottom plate of each capacitor in each row is connected to its respective control line that is achieved using the array map replaced with ascending numbers such as depicted in FIG. 9. As seen in FIG. 10, since the first element of the top row is eight (8), its equivalent ascending number is two (2). Element 8 is therefore connected to the second control line from the top. With continued reference to FIG. 11, since the second element of the top row is five (5), it is connected to the first control line from the top because its equivalent ascending number is one (1). Both, array map 600 provided by the user, and array map 900 having equivalent ascending numbers, are read together while connecting each bottom plate. In this way, if the algorithm reads 'D' in the original array map 600, it automatically connects that capacitor to the dummy line.

FIG. 12 is a diagram illustrating a technique to identify all unique numbers in an array for the array map file 600 depicted in FIG. 6 according to one embodiment of the present invention. It can easily be seen that in the array 900, unique numbers are 1, 4, 5, 6, 8 and 9. This step is combined with additional steps described herein below to connect all of the vertical lines to the main control lines to remove all the opens created by horizontally routed control lines.

FIG. 13 is a diagram illustrating a technique to replace all elements of the array map file 600 depicted in FIG. 6 with their respective position in the unique number list 1200 depicted in FIG. 12 according to one embodiment of the present invention. Since array element 8 in the top row has position 5 in the unique number list 1200, for example, it is replaced with the number 5.

Figure 14:
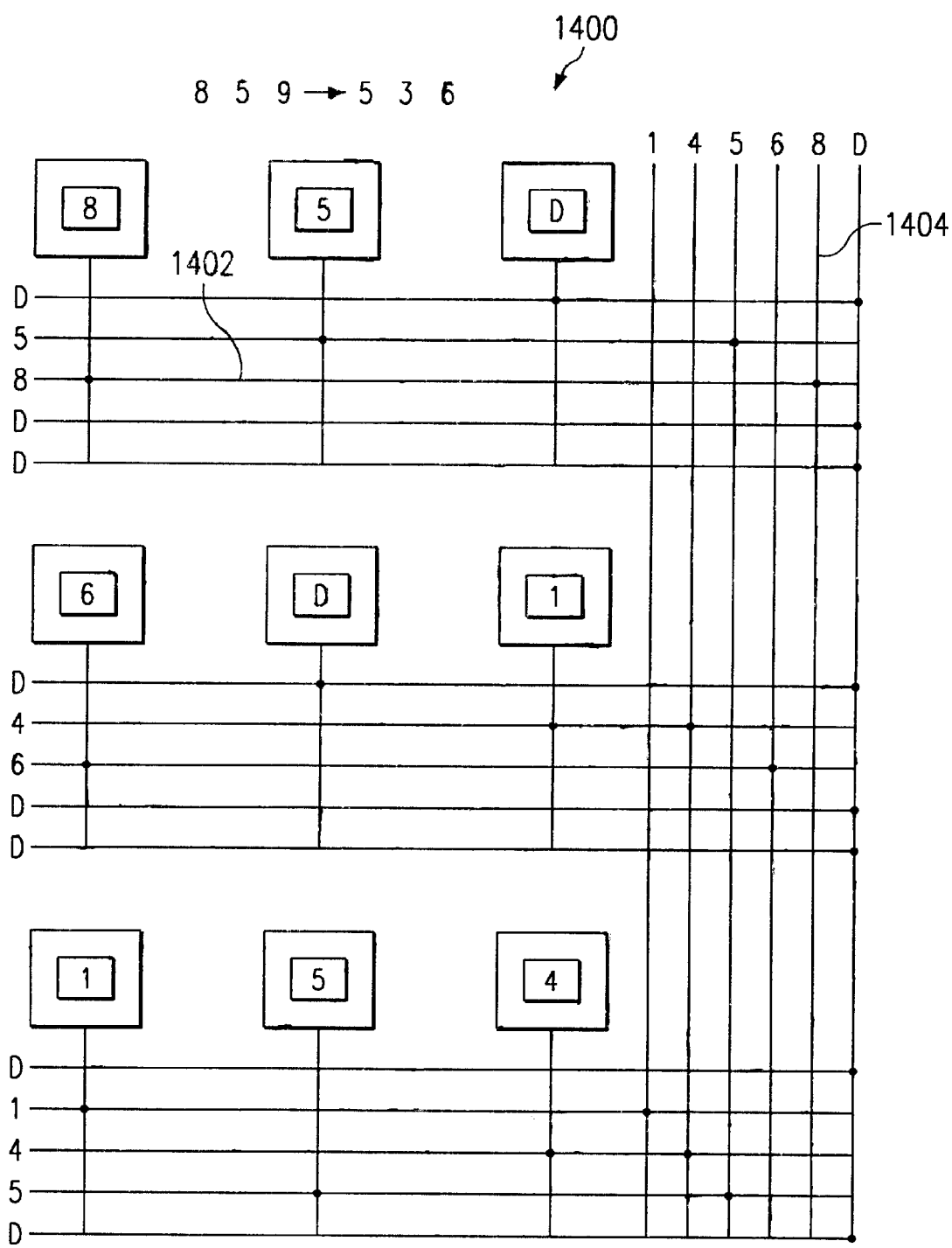
FIG. 14 is a pictorial diagram illustrating a method of horizontal line connectivity associated with the array map depicted in FIG. 6 according to one embodiment of the present invention.

FIG. 14 is a pictorial diagram illustrating a horizontal line connectivity structure 1400 associated with the array map file 600 depicted in FIG. 6 according to one embodiment of the present invention. It can be seen that the horizontal control line 1402 connected to array element 8 is now also connected to the fifth vertical line 1404. This same technique is then implemented for the remaining elements of the array to achieve the horizontal line connectivity structure 1400 depicted in FIG. 14.

In summary explanation of the above, the present invention is directed to an algorithmic technique to generate matched capacitor arrays used in A/D converter, D/A converters and programmable gain amplifiers, among other things. The technique implements automatic program-based generation of the array layout using templates to define the style of the layout such that any defined style of capacitor array can be generated. The method uses design rules of different processes to tailor the array for each specific case such that the layout is optimized for each process. Since each array can be generated from a particular electrical specification, multiple arrays within a common IC can be optimized for different purposes to preserve silicon area.

This invention has been described in considerable detail in order to provide those skilled in the equalizer art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of automatically generating a matched capacitor array, the method comprising the steps of:
    (a) accepting desired process design rules;
    (b) accepting a capacitor array map file;
    (c) accepting user specific rules;
    (d) accepting unit capacitor cell x and y active area dimensions;
    (e) generating a unit capacitor cell from the design rules, the array map file, the user specific rules, and the x and y active area dimensions;
    (f) generating a master data file from the design rules, the array map file, the user specific rules, and the x and y active area dimensions;
    (g) placing a plurality of unit capacitor cells in array fashion according to unit capacitor cell data and the master data file;
    (h) mapping group numbers associated with the unit capacitor cells in each row to virtual numbers;
    (i) connecting bottom capacitor plates of each unit capacitor cell to a horizontal control line determined by its mapped virtual number;
    (j) connecting each horizontal control line to a respective main control line; and
    (k) connecting top capacitor plates of each unit capacitor cell to a main top plate line.

2. The method of automatically generating a matched capacitor array according to claim 1 further comprising the step of generating a signal name for each main control line such that each main control line is associated with a respective group number.

3. The method of automatically generating a matched capacitor array according to claim 2 further comprising the step of extracting parasitic capacitance data from the array and analyzing array layout accuracy therefrom.

4. The method of automatically generating a matched capacitor array according to claim 1 wherein the step of accepting capacitor array design rules comprises providing interlayer rules defined for a particular process to render this method independent.

5. The method of automatically generating a matched capacitor array according to claim 1 wherein the step of providing unit capacitor cell x and y active area dimensions comprises accepting an ASCII representation of capacitor distribution in an area having dimensions x by y such that this method is operable for any 'x' and 'y' dimensions.

6. The method of automatically generating a matched capacitor array according to claim 1 wherein the step of generating a master data file comprises generating a data file including location of each unit capacitor cell in an array, a group name to which each unit capacitor cell belongs, and a total number of control lines to be routed between rows of unit capacitor cells.

7. The method of automatically generating a matched capacitor array according to claim 1 wherein the step of placing a plurality of unit capacitor cells in array fashion comprises creating a top cell having an origin designated as 0:0, and placing each unit capacitor cell therein.

8. The method of automatically generating a matched capacitor array according to claim 1 wherein the step of mapping group numbers comprises assigning a distinct virtual number to each distinct group number within each row of the capacitor array map file, wherein the virtual numbers for each row range from 1 up to a maximum number determined by the number of distinct group numbers in each row, and further wherein each identical distinct group number within a row has the same virtual number.

9. The method of automatically generating a matched capacitor array according to claim 1 wherein the step of connecting each horizontal control line comprises identifying all unique group numbers in the array map file and placing the unique group numbers in ascending order.

10. The method of automatically generating a matched capacitor array according to claim 9 wherein the step of connecting each horizontal control line further comprises associating each unique group number with its respective position within the ascending order of unique group numbers.

11. The method of automatically generating a matched capacitor array according to claim 10 wherein the step of connecting each horizontal control line further comprises correlating the respective position associated with each unique group number with a respective vertical control line within a plurality of vertical control lines.

12. The method of automatically generating a matched capacitor array according to claim 11 wherein the step of connecting each horizontal control line further comprises connecting each horizontal control line to a vertical control line such that each horizontal control line and its connected vertical control line are associated with a common respective position.

13. A method of automatically generating a matched capacitor array, the method comprising the steps of:

(a) providing a capacitor array map file comprising different groups of capacitors wherein each group other than a dummy capacitor group is associated with a distinct group number;

(b) determining a total number of distinct group numbers for each row of the matched capacitor array;

(c) associating each dummy capacitor group within the array with a distinct group number equal to the largest total number of distinct group numbers plus one;

(d) replacing each group within each row with an equivalent ascending number, wherein each ascending number within a row is determined by the distinct group numbers in step (b) and the distinct group number plus one in step (c), and further wherein the ascending numbers range from one to the largest total number of distinct group numbers plus one; and (e) implementing a matched capacitor array such that bottom plates associated with each distinct group of capacitors are connected to a respective control line, wherein the ascending number associated with each distinct group of capacitor cells defines the control line that is connected to the bottom plates.

14. The method of automatically generating a matched capacitor array according to claim 13 further comprising the step of connecting each control line to a respective main control line such that each main control line is substantially perpendicular to its connected control line.

15. The method of automatically generating a matched capacitor array according to claim 14 wherein the step of connecting each control line to a respective main control line comprises placing all distinct group numbers identified in step (a) and step (c) in ascending order such that each distinct group of capacitor cells can be defined by its position within the ascending order of distinct group numbers.

16. The method of automatically generating a matched capacitor array according to claim 15 wherein the step of connecting each control line to a respective main control line further comprises placing each main control line such that it has a position relative to all other main control lines that is determined by the position within the ascending order of distinct group numbers.

17. The method of automatically generating a matched capacitor array according to claim 13 further comprising the steps of:

(f) providing capacitor array design rules;

(g) providing custom rules;

(h) providing unit capacitor cell x and y active area dimensions;

(i) generating a unit capacitor cell from the design rules, the array map file, the custom rules, and the x and y active area dimensions;

(j) generating a master data file from the design rules, the array map file, the custom rules, and the x and y active area dimensions;

(k) placing a plurality of unit capacitor cells in array fashion according to unit capacitor cell data and the master data file; and (l) mapping group numbers associated with the unit capacitor cells in each row to virtual numbers that can be used to identify the distinct group numbers.

18. The method of automatically generating a matched capacitor array according to claim 17 further comprising the step of generating a signal name for each main control line such that each main control line is associated with a distinct group number.

19. The method of automatically generating a matched capacitor array according to claim 18 further comprising the step of extracting parasitic capacitance data from the array and analyzing array layout accuracy therefrom.

20. The method of automatically generating a matched capacitor array according to claim 17 wherein the step of providing capacitor array design rules comprises providing interlayer rules defined for a particular process.

21. The method of automatically generating a matched capacitor array according to claim 17 wherein the step of providing unit capacitor cell x and y active area dimensions comprises providing an ASCII representation of capacitor distribution in an area having dimensions x by y.

22. The method of automatically generating a matched capacitor array according to claim 17 wherein the step of generating a master data file comprises generating a data file including location of each unit capacitor cell in an array, a group name to which each unit capacitor cell belongs, and a total number of control lines to be routed between rows of unit capacitor cells.

23. The method of automatically generating a matched capacitor array according to claim 17 wherein the step of placing a plurality of unit capacitor cells in array fashion comprises creating a top cell having an origin designated as 0:0, and placing each unit capacitor cell therein.

* * * * *